US012647184B2

(12) United States Patent
Menchetti et al.

(10) Patent No.: US 12,647,184 B2
(45) Date of Patent: Jun. 2, 2026

(54) NETWORK NODE

(71) Applicant: British Telecommunications Public Limited Company, London (GB)

(72) Inventors: Marco Menchetti, London (GB); Liam Bussey, London (GB); Fraser Burton, London (GB)

(73) Assignee: BRITISH TELECOMMUNICATIONS PUBLIC LIMITED COMPANY, London (GB)

( * ) Notice: Subject to any disclaimer, the term of this patent is extended or adjusted under 35 U.S.C. 154(b) by 0 days.

(21) Appl. No.: 19/103,398

(22) PCT Filed: Jul. 11, 2023

(86) PCT No.: PCT/EP2023/069158
§ 371 (c)(1),
(2) Date: Feb. 12, 2025

(87) PCT Pub. No.: WO2024/037792
PCT Pub. Date: Feb. 22, 2024

(65) Prior Publication Data
US 2026/0012259 A1     Jan. 8, 2026

(30) Foreign Application Priority Data
Aug. 17, 2022    (EP) .................................... 22190757

(51) Int. Cl.
*H04B 10/00*         (2013.01)
*G01R 29/08*         (2006.01)
(Continued)

(52) U.S. Cl.
CPC ... *H04B 10/25759* (2013.01); *G01R 29/0885* (2013.01); *H04B 10/676* (2013.01); *H04B 2210/006* (2013.01)

(58) Field of Classification Search
CPC .......... H04B 10/25759; H04B 10/2575; H04B 10/25751; H04B 10/25752;
(Continued)

(56) References Cited

U.S. PATENT DOCUMENTS

| | | | |
|---|---|---|---|
| 4,590,597 A | 5/1986 | Long-Sheng et al. | |
| 5,905,586 A | 5/1999 | Even | |
(Continued)

FOREIGN PATENT DOCUMENTS

| | | |
|---|---|---|
| CN | 1494778 | 5/2004 |
| CN | 101888269 | 11/2010 |
(Continued)

OTHER PUBLICATIONS

Notice of Allowance dated Aug. 5, 2025 issued for U.S. Appl. No. 18/247,946 (10 pages).
(Continued)

*Primary Examiner* — Hanh Phan
(74) *Attorney, Agent, or Firm* — Nixon & Vanderhye P.C.

(57) ABSTRACT

This invention provides a network node comprising: an optical fibre interface configured to receive, from one or more remote optical sources, a first optical signal, a second optical signal and a third optical signal, wherein the first, second and third optical signals each have a respective wavelength within an optical fibre transmission band being one of the O-band, E-band, S-band, C-band, L-band, and U/XL-band; one or more wavelength converters configured to convert the wavelength of one or more of the first optical signal, second optical signal and third optical signal; and a Rydberg-atom based transmission medium configured to be excited by the first optical signal, second optical signal and third optical signal, following wavelength conversion of one or more of the first optical signal, second optical signal and third optical signal, such that electrons of the Rydberg-atom (Continued)

1 ⟶

Core network node 100 — MUX 400 — Fibre Network 500 — DEMUX 600 — Splitter 700 — 1st Rydberg Detector 200 — 1st photodetector 800 — 2nd Rydberg Detector 300 — 2nd Photodetector 900 based transmission medium are excited to a predetermined Rydberg state.

13 Claims, 5 Drawing Sheets

(51) Int. Cl.
     _H04B 10/2575_        (2013.01)
     _H04B 10/67_          (2013.01)
(58) Field of Classification Search
     CPC .. H04B 10/25753; H04B 10/70; H04B 10/40; H04B 10/27; H04B 10/291; H04B 10/503; G01R 29/0885; G01R 29/0892
     USPC ... 398/115, 116, 117, 66, 67, 68, 69, 70, 71, 398/72, 79, 135, 136, 158, 159, 176, 25, 398/26, 27, 33, 38.182, 183, 188; 324/457, 96
     See application file for complete search history.

(56)                    References Cited

U.S. PATENT DOCUMENTS

| | | | |
|---|---|---|---|
| 6,233,080 B1 | 5/2001 | Brenner et al. | |
| 6,580,513 B2 | 6/2003 | Akahoshi | |
| 6,782,017 B1 | 8/2004 | Kai | |
| 6,842,587 B1 | 1/2005 | Mcghan et al. | |
| 8,036,529 B2 | 10/2011 | Kim et al. | |
| 8,565,609 B2 | 10/2013 | Wilkinson et al. | |
| 11,165,505 B2 * | 11/2021 | Gordon | H01Q 1/366 |
| 11,218,222 B1 | 1/2022 | Perry | |
| 12,411,162 B2 * | 9/2025 | Burton | G01R 29/0885 |
| 2002/0093661 A1 | 7/2002 | Akahoshi | |
| 2002/0145776 A1 | 10/2002 | Chow et al. | |
| 2003/0138007 A1 | 7/2003 | Lee et al. | |
| 2004/0033021 A1 | 2/2004 | Oguri et al. | |
| 2004/0120721 A1 | 6/2004 | Wang | |
| 2008/0138073 A1 | 6/2008 | Kim | |
| 2009/0060510 A1 | 3/2009 | Baca | |
| 2010/0196010 A1 | 8/2010 | Miura | |
| 2011/0234435 A1 | 9/2011 | Woodward et al. | |
| 2012/0177373 A1 | 7/2012 | Choi | |
| 2014/0376907 A1 | 12/2014 | Vassilieva et al. | |
| 2017/0288773 A1 | 10/2017 | Stiscia et al. | |
| 2019/0109666 A1 | 4/2019 | Kato et al. | |
| 2020/0292606 A1 | 9/2020 | Holloway et al. | |
| 2022/0196719 A1 | 6/2022 | Walker et al. | |
| 2023/0379055 A1 * | 11/2023 | Menchetti | H04B 10/69 |

FOREIGN PATENT DOCUMENTS

| | | | |
|---|---|---|---|
| CN | 108809341 A | 11/2018 | |
| CN | 110401492 A | 11/2019 | |
| CN | 110752883 A | 2/2020 | |
| EP | 0331303 A2 | 9/1989 | |
| EP | 0911928 A2 | 4/1999 | |
| GB | 2570109 A | 7/2019 | |
| GB | 2599468 A | 4/2022 | |
| JP | 2002-261697 | 9/2002 | |
| JP | 2006073755 A | 3/2006 | |
| JP | 2019041364 | 3/2019 | |
| WO | 2011014251 | 2/2011 | |
| WO | 2021078438 A1 | 4/2021 | |

OTHER PUBLICATIONS

Office Action dated Jan. 16, 2025 issued for U.S. Appl. No. 18/247,946 (12 pages).

International Preliminary Report on Patentability dated Feb. 27, 2025, issued for International Application No. PCT/EP2023/069158 (9 pages).

First Notification of Office Action dated Mar. 14, 2025, issued for Chinese Application No. 202180067952.3 (8 pages).

Maria Langbecker et al., "Rydberg excitation of cold atoms inside a hollow core fiber", arxiv.org, Cornell University Library, 201 Olin Library Cornell University Ithaca, NY 14853, Jun. 23, 2017, 6 pages.

S. H. You et al., "Microwave-field sensing via electromagnetically induced absorption of Rb irradiated by three-color infrared lasers", Optics Express, vol. 30, No. 10, May 9, 2022, 11 pages.

Zhenfei Song et al., "Rydberg-atom-based digital communication using a continuously tunable radio-frequency carrier", Optics Express, vol. 27, No. 6, Mar. 18, 2019, 10 pages.

Joshua A. Gordon et al., "Weak electric-field detection with sub-1 Hz resolution at radio frequencies using a Rydberg atom-based mixer", AIP Advances 9, 045030 (2019), Apr. 25, 2019, 6 pages.

N. Thaicharoen et al., "Electromagnetically-induced transparency, absorption, and microwave field sensing in a Rb vapor cell with a three-color all-infrared laser system", arXiv:1905.09925v1 [physics. atom-ph], May 23, 2019, 9 pages.

Combined Search and Examination Report for GB2106349.0 Dated Nov. 4, 2021, 10 pages.

Combined Search and Examination Report for GB2211997.8 Dated Feb. 3, 2023, 5 pages.

EP Search Report for EP22190757.9 dated Jan. 31, 2023, 10 pages.

Exam Report for GB2211997.8 dated Apr. 8, 2024, 4 pages.

GB Combined Search & Exam Report for GB2015745.9 dated Apr. 6, 2021, 9 pages.

Intention to Grant GB2211997.8 dated Jul. 3, 2024, 2 pages.

International Preliminary Report on Patentability for PCT/EP021/074943 issued Jan. 16, 2023, 8 pages.

International Search Report and the Written Opinion for PCT/EP2021/074943 dated Dec. 23, 2021, 12 pages.

Search and Examination Report for GB2015745.9 Dated Jul. 19, 2021, 8 pages.

Search and Examination Report for GB2106349.0 Dated Apr. 13, 2023, 7 pages.

The International Search Report and the Written Opinion for PCT/EP2023/069158 Dated Oct. 11, 2023, 14 pages.

Written Opinion of the International Preliminary Examination for PCT/EP2021/074943 Dated Sep. 26, 2022, 6 pages.

Notice of Completion of Formalities for Patent Registration dated Jun. 30, 2025, issued for Chinese Application No. 202180067952.3 (3 pages).

* cited by examiner

200

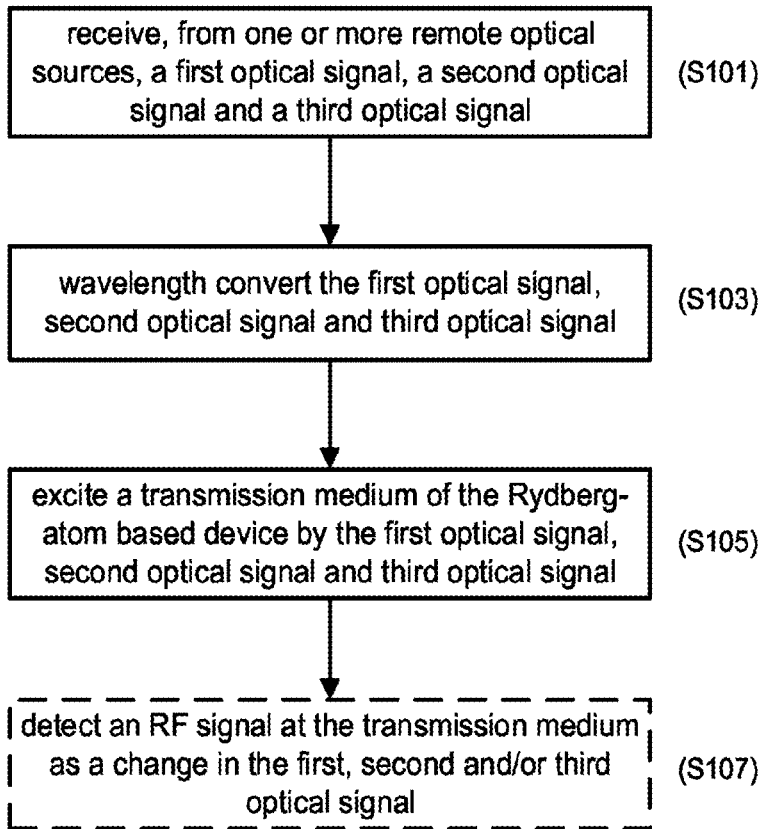

receive, from one or more remote optical
sources, a first optical signal, a second optical
signal and a third optical signal          (S101)

wavelength convert the first optical signal,
second optical signal and third optical signal          (S103)

excite a transmission medium of the Rydberg-
atom based device by the first optical signal,
second optical signal and third optical signal          (S105)

detect an RF signal at the transmission medium
as a change in the first, second and/or third
optical signal          (S107)

Figure 5

NETWORK NODE

CROSS-REFERENCE TO RELATED APPLICATONS

This application is the U.S. national phase of International Application No. PCT/EP2023/069158 filed Jul. 11, 2023 which designated the U.S. and claims priority to EP 22190757.9 filed Aug. 17, 2022, the entire contents of each of which are hereby incorporated by reference.

FIELD OF THE INVENTION

The present invention relates to a network node, a telecommunications network comprising the network node, and a method of operating the network node.

BACKGROUND

There is an emerging field of Rydberg-atom based devices, such as atomic radio detectors, atomic clocks and atomic gravimeters. These Rydberg-atom based devices often utilise a laser signal to excite an electron of an atomic medium, typically comprising Rubidium, Caesium or Strontium atoms, to a Rydberg state. For example, in an atomic radio detector based on an atomic medium of Rubidium-85 atoms, a first laser signal at 780 nm may be used to excite electrons from the Rubidium atom's ground state to a first excited state, and a second laser signal may then be used to excite electrons from this first excited state to a Rydberg state. A common wavelength for the second laser signal is 480 nm, which excites electrons to a particular Rydberg state from which radio frequencies standardised for use in cellular telecommunications protocols may be detected.

The present inventors recognise a problem with such Rydberg-atom based devices in that optical signals at these wavelengths suffer from high attenuation when being communicated over conventional optical fibres. In other words, these optical signals are outside the conventional optical fibre transmission bands, such as the O-band (1260-1360 nm), E-band (1360-1460 nm), S-band (1460-1530 nm), C-band (1530-1565 nm), L-band (1565-1625 nm), or U/XL-band (1625-1675 nm). These optical signals are therefore produced by local optical signal sources (i.e. integrated with the Rydberg-atom based device) rather than by remote optical signal sources. Remote optical signal generation would require relatively high-power optical sources to compensate for the attenuation and ensure that the optical signals had sufficient power at the Rydberg-atom based device. Remote optical signal generation is therefore relatively expensive and unsafe.

For long-term operation, these laser signals should be stabilised at the desired wavelengths. In an example, the stability of the first laser signal exciting an electron from the Rubidium-85 atom's ground state to the first excited state (which has a linewidth of around 6 MHz) should not deviate by more than 1 MHz over the time frame of operation to ensure efficient operation. This may be achieved using a saturation absorption spectroscopy technique, but this requires expensive and dedicated equipment. Accordingly, mass deployment of Rydberg-atom based devices (such as in a wireless telecommunications network in which each wireless device includes a Rydberg-atom based radio frequency detector) may be prohibitively expensive as each device requires locally applied saturation absorption spectroscopy to stabilise the laser signal.

SUMMARY OF THE INVENTION

According to a first aspect of the invention, there is provided a network node comprising: an optical fibre interface configured to receive, from one or more remote optical sources, a first optical signal, a second optical signal and a third optical signal, wherein the first, second and third optical signals each have a respective wavelength within an optical fibre transmission band being one of the O-band, E-band, S-band, C-band, L-band, and U/XL-band; one or more wavelength converters configured to convert the wavelength of one or more of the first optical signal, second optical signal and third optical signal; and a Rydberg-atom based transmission medium configured to be excited by the first optical signal, second optical signal and third optical signal, following wavelength conversion of one or more of the first optical signal, second optical signal and third optical signal, such that electrons of the Rydberg-atom based transmission medium are excited to a predetermined Rydberg state.

The network node may further comprise a wavelength converter of the one or more wavelength converters is configured to halve the wavelength of the first optical signal, second optical signal and/or third optical signal.

The network node may further comprise a photodetector configured to detect an RF signal at the Rydberg-atom based transmission medium as a change in the first, second and/or third optical signal due to the electrons of the Rydberg-atom based transmission medium being excited by the RF signal from the predetermined Rydberg state to a further Rydberg state.

The network node may be comprised in a telecommunications network, the telecommunications network further comprising one or more optical sources, remote from the network node, configured to generate the first optical signal, the second optical signal and the third optical signal, and communicate the first, second and third optical signals to the network node, wherein the communicated first, second and third optical signals each have a respective wavelength within an optical fibre transmission band being one of the O-band, E-band, S-band, C-band, L-band, and U/XL-band.

The network node may be one of a plurality of network nodes, the one or more optical sources may be remote from each network node of the plurality of network nodes, and each network node of the plurality of network nodes may comprise: a respective optical fibre interface configured to receive, from the one or more optical sources, the first optical signal, the second optical signal and the third optical signal; one or more respective wavelength converters configured to convert the wavelength of one or more of the first optical signal, second optical signal and third optical signal; and a respective Rydberg-atom based transmission medium configured to be excited by the first optical signal, second optical signal and third optical signal, following wavelength conversion of one or more of the first optical signal, second optical signal and third optical signal, such that electrons of the respective Rydberg-atom based transmission medium are excited to a respective predetermined Rydberg state.

The or each network node may be a Rydberg-atom based Radio Frequency, RF, detector.

The telecommunications network may further comprise: a photodetector configured to detect an RF signal at the Rydberg-atom based transmission medium as a change in the first, second and/or third optical signal due to the electrons of the Rydberg-atom based transmission medium being excited by the RF signal from the predetermined Rydberg state to a further Rydberg state The one or more optical sources may further comprise a wavelength stabilising module for wavelength stabilising the first optical signal, second optical signal and/or the third optical signal.

According to a second aspect of the invention, there is provided a method of operating a network node in a telecommunications network, the method comprising the steps of: receiving, from one or more remote optical sources, a first optical signal, a second optical signal and a third optical signal, wherein the first, second and third optical signals each have a respective wavelength within an optical fibre transmission band being one of the O-band, E-band, S-band, C-band, L-band, and U/XL-band; converting the wavelength of one or more of the first optical signal, second optical signal and third optical signal and exciting a Rydberg-atom based transmission medium by the first optical signal, second optical signal and third optical signal, following wavelength conversion of one or more of the first optical signal, second optical signal and third optical signal, such that electrons of the Rydberg-atom based transmission medium are excited to a predetermined Rydberg state.

The method may further comprise the step of: detecting a Radio Frequency, RF, signal at the Rydberg-atom based transmission medium as a change in the first, second and/or third optical signal due to the electrons of the Rydberg-atom based transmission medium being excited by the RF signal from the predetermined Rydberg state to a further Rydberg state.

According to a third aspect of the invention, there is provided a computer program comprising instructions to cause the network node the first aspect of the invention to carry out the steps of the method of the second aspect of the invention. The computer program may be stored on a computer readable carrier medium.

BRIEF DESCRIPTION OF THE FIGURES

In order that the present invention may be better understood, embodiments thereof will now be described, by way of example only, with reference to the accompanying drawings in which:

FIG. 5 is a flow diagram illustrating a method of operating the Rydberg-atom based radio frequency detector of the network of FIG. 1.

DETAILED DESCRIPTION

Figure 1:
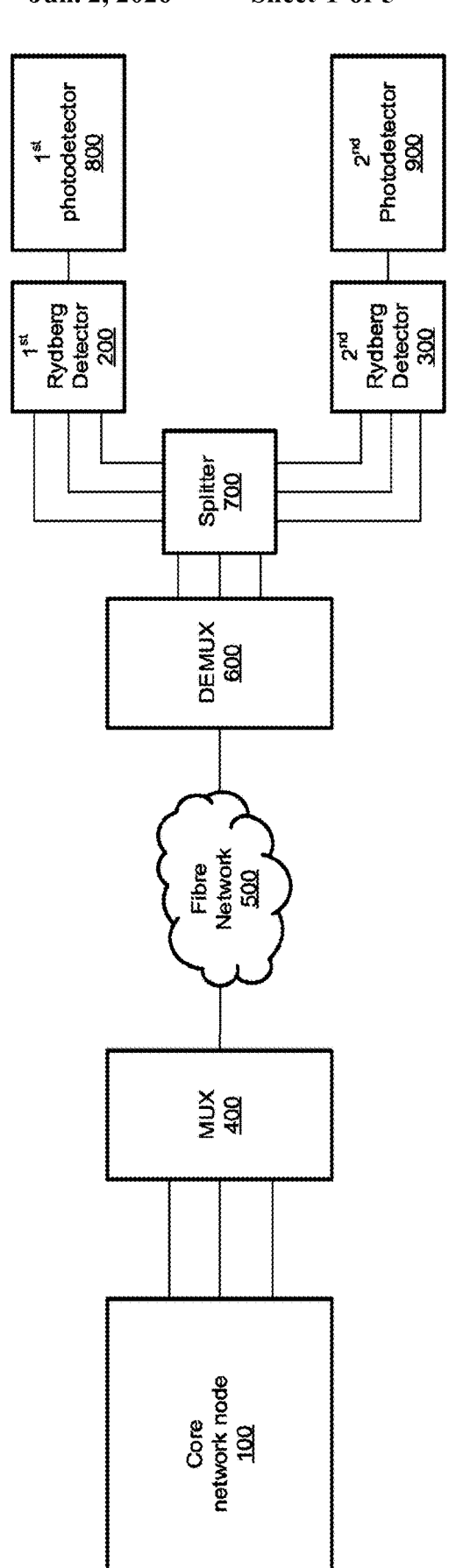
FIG. 1 is a schematic diagram of a telecommunications network.
Figure 2:
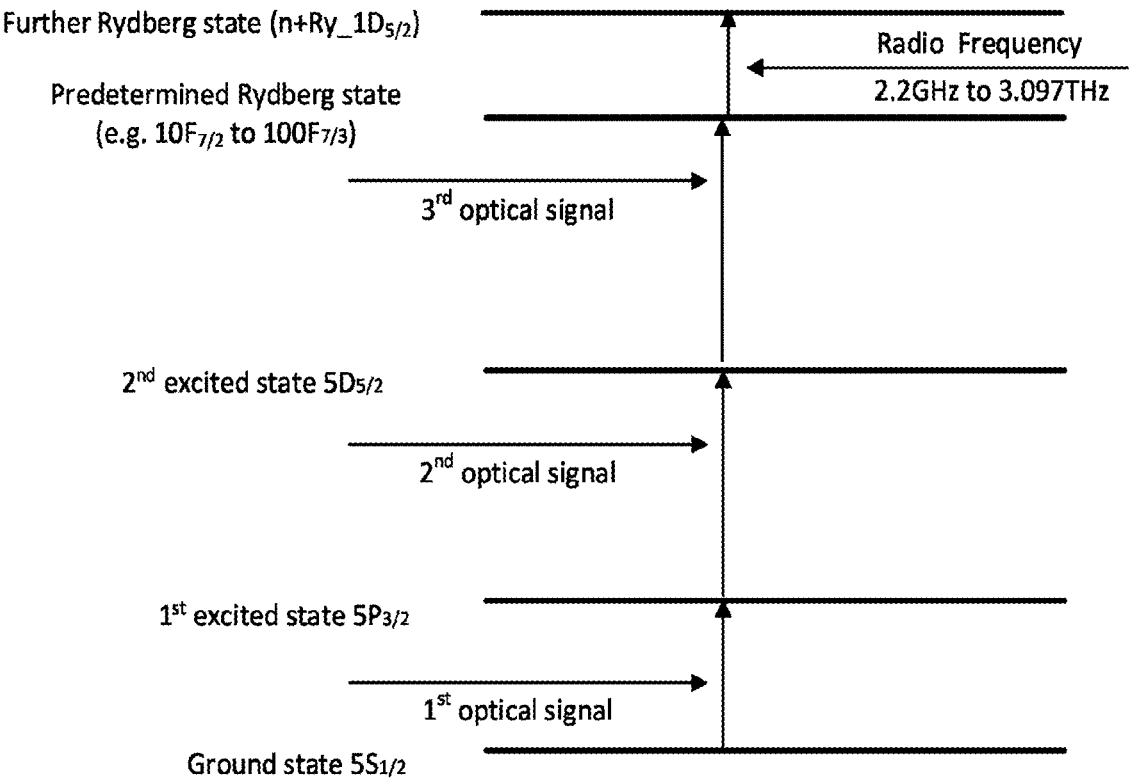
FIG. 2 is an energy level diagram illustrating excitation of a Rydberg-atom based radio frequency detector of the network of FIG. 1.

FIG. 1 illustrates a telecommunications network 1. The telecommunications network 1 includes a core network node 100, a first Rydberg-atom based Radio Frequency (RF) detector 200 and a second Rydberg-atom based RF detector 300. The core network node 100 is configured to generate a first optical signal, second optical signal, and a third optical signal (described in detail below). The first and second Rydberg-atom based RF detectors 200, 300 are configured to receive these first, second and third optical signals and excite electrons of their respective Rydberg-atoms to a predetermined Rydberg state. This is illustrated in FIG. 2, which illustrates the first optical signal (which may be known as a "pump" signal) exciting electrons of the Rydberg atoms from the ground state ($5S_{1/2}$) to a first excited state ($5P_{3/2}$), the second optical signal (which may be known as a "probe" signal) exciting electrons of the Rydberg atoms from the first excited state ($5P_{3/2}$) to a second excited state ($5D_{3/2}$), and the third optical signal (which may be known as a "coupling" signal) exciting electrons of the Rydberg atoms from the second excited state ($5D_{3/2}$) to the predetermined Rydberg state. In this predetermined Rydberg state, the Rydberg-atoms experience Electromagnetically Induced Transparency (EIT) such that the Rydberg-atoms become transparent to the probe optical signal. An incident Radio Frequency (RF) signal at the first or second Rydberg-atom based RF detector 200, 300 may then further excite electrons from the predetermined Rydberg state to a further Rydberg state, wherein the energy difference between the predetermined Rydberg state and the further Rydberg state matches the energy of the RF signal (as determined by its frequency). This further excitation of electrons due to the RF signal is detectable as a change in the probe optical signal, such as a change in transparency and therefore a change in power.

The first and second Rydberg-atom based RF detectors 200, 300 may therefore be used as a detector for RF signals at a particular frequency by selecting wavelengths for the pump, probe and coupling optical signals so as to elevate electrons of the Rydberg-atoms to a predetermined Rydberg state that has an energy difference with a further Rydberg state that corresponds with the frequency of that RF signal.

Turning back to FIG. 1, the pump, probe and coupling optical signals generated by the core network node 100 are provided to a multiplexor 400. The multiplexed optical signals are then communicated over an optical network 500 to a demultiplexer 600. The demultiplexed pump, probe and coupling optical signals are then split by splitter 700 and provided to each Rydberg-atom based RF detector 200, 300. The telecommunications network 1 also includes a first and second photodetector 800, 900. The first photodetector 800 is configured to receive the probe optical signal from the first Rydberg-atom based RF detector 200 and the second photodetector 900 is configured to receive the probe optical signal from the second Rydberg-atom based RF detector 300.

Figure 3:
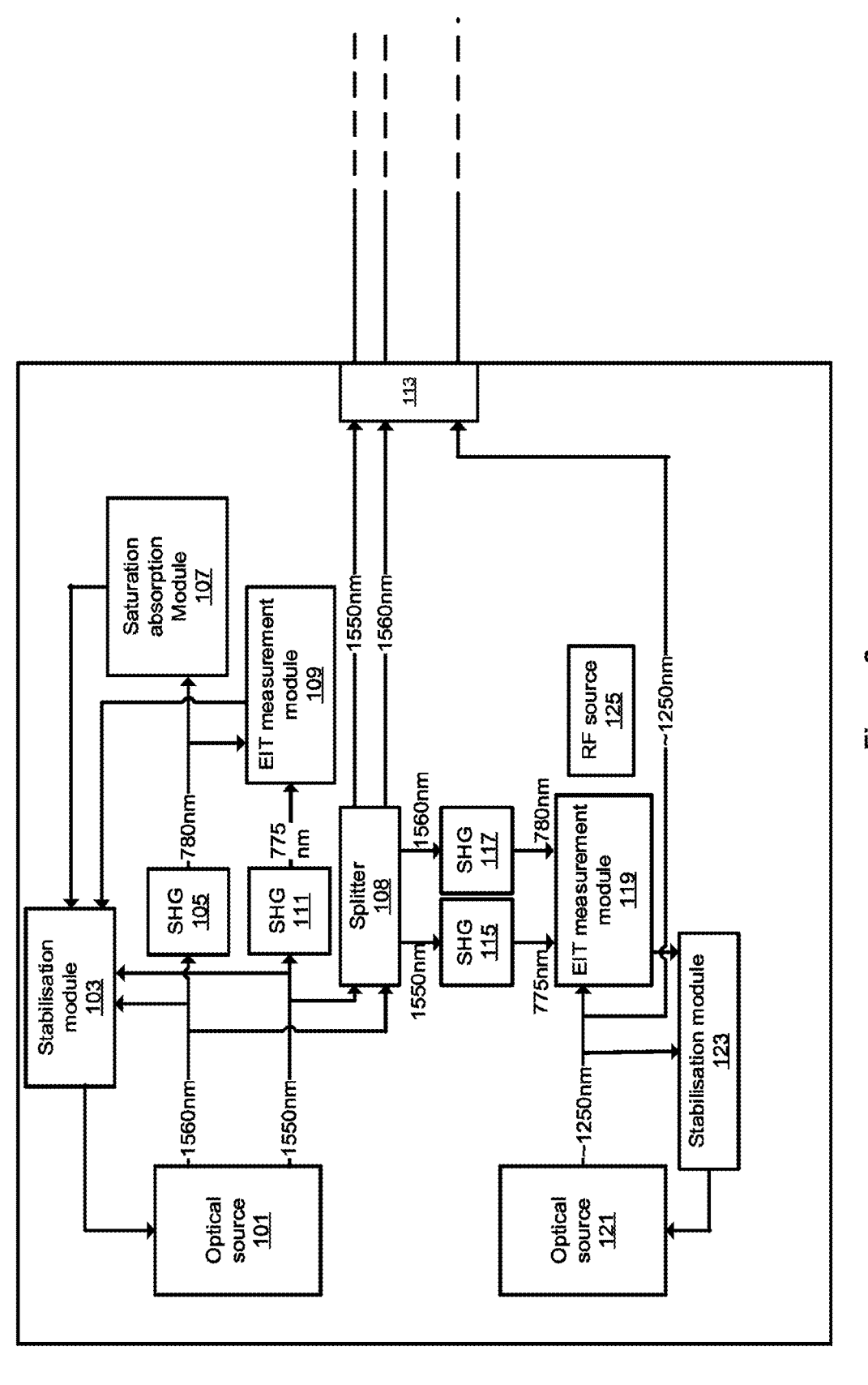
FIG. 3 is a schematic diagram of a core network node of the network of FIG. 1.

The core network node 100 is shown in more detail in FIG. 3. The core network node 100 includes a first optical source 101, such as an External Cavity Diode Laser (ECDL), Distributed Feedback Laser (DFL), or fibre laser. The first optical source 101 generates the pump optical signal having wavelength 1550 nm and a probe optical signal having wavelength 1560 nm. This is achieved by generating an initial optical signal having a range covering both 1550 nm and 1560 nm (e.g. 1540 nm to 1570 nm) and passing this initial optical signal through a first resonant cavity with a first reference at 1550 nm (to generate the pump optical signal at 1550 nm) and a second reference at 1560 nm (to generate the probe optical signal at 1560 nm). The first optical cavity is controllable (as described below) to compensate for any drift from these two wavelengths.

The first optical source 101 communicates the pump optical signal at 1550 nm in three paths—a first path of the pump optical signal from the first optical source 101 to a first stabilisation module 103, a second path of the pump optical signal from the first optical source 101 to a first Second Harmonic Generator (SHG) 111, and a third path of the pump optical signal from the first optical source 101 to a splitter 108. Following the first path of the pump optical signal from the first optical source 101 to the first stabilisation module 103, the first stabilisation module 103 acts to frequency lock the pump optical signal. This may be achieved using a multiwavelength reference cavity or comb locking system.

Following the second path of the pump optical signal from the first optical source 101 to the first SHG 111, the first SHG 111 wavelength converts the pump optical signal from 1550 nm to 775 nm (that is, the pump optical signal is wavelength-halved or, in other words, frequency doubled), equal to the wavelength required to elevate an electron of the Rydberg-atom in the first and second Rydberg-atom based RF detectors 200, 300 from the ground state to the first excited state. The pump optical signal at 775 nm is communicated from the first SHG 111 to the first Electromagnetically Induced Transparency (EIT) measurement module 109. Operation of the first EIT measurement module 109 is explained below.

Turning back to the first optical source 101, the first optical source 101 communicates the probe optical signal at 1560 nm in three paths—a first path of the probe optical signal from the first optical source 101 to the first stabilisation module 103, a second path of the probe optical signal from the first optical source 101 to a second SHG 105, and a third path of the probe optical signal from the first optical source 101 to the splitter 108. The first stabilisation module 103 acts to frequency lock the probe optical signal.

Following the second path of the probe optical signal from the first optical source 101 to the second SHG 105, the second SHG 105 converts the probe optical signal from 1560 nm to 780 nm (that is, the probe optical signal is wavelength-halved or, in other words, frequency doubled) equal to the wavelength required to elevate an electron of the Rydberg-atom in the first and second Rydberg-atom based RF detectors 200, 300 from the first excited state to the second excited state. The probe optical signal at 780 nm is then communicated in two paths, a first path from the second SHG 105 to a saturation absorption module 107 and a second path from the second SHG 105 to the first EIT measurement module 109. Following the first path from the first SHG 105 to the saturation absorption module 107, the saturation absorption module 107 is configured to absorb the probe optical signal at 780 nm and produce a first reference signal representative of the absorption of the probe optical signal. This first reference signal is used by the stabilisation module 103 in a feedback control mechanism to control the first resonant cavity to maximise the amount of the probe optical signal absorbed by the saturation absorption module 107. The saturation absorption module 107, stabilisation module 103 and first resonant cavity therefore cooperate to stabilise the probe optical source at 1560 nm, double the wavelength required to elevate an electron of the Rydberg-atom in the first and second Rydberg-atom based RF detectors 200, 300 from the first excited state to the second excited state.

By acting on both the probe optical signal at 1560 nm (received on the first path from the first optical source 101) and the first reference signal (received from the saturation absorption module 107), the first stabilisation module 103 both frequency locks (for relatively short-term stability) and stabilises (for relatively long-term stability) the probe optical signal produced by the first optical source 101.

As noted above, the first EIT measurement module 109 receives both the pump optical signal at 775 nm from the first SHG 111 and the probe optical signal at 780 nm from the second SHG 105. The first EIT measurement module 109 is configured to absorb the pump optical signal at 775 nm and the probe optical signal at 780 nm and produce a second reference signal representative of the absorption of the pump optical signal. It is noted that this second reference signal is only representative of the absorption of the pump optical signal as the first optical signal has been stabilised by cooperation of the saturation absorption module 107, stabilisation module 103 and first resonant cavity, as described above. This second reference signal is used by the stabilisation module 103 in a feedback control mechanism to control the first resonant cavity to maximise the amount of the pump optical signal at 775 nm absorbed by the first EIT measurement module 109. The first EIT measurement module 109, stabilisation module 103 and first resonant cavity therefore cooperate to stabilise the pump optical source at 1550 nm, double the wavelength required to elevate an electron of the Rydberg-atom in the first and second Rydberg-atom based RF detectors 200, 300 from the ground state to the first excited state.

By acting on both the pump optical signal at 1550 nm (received on the first path of the pump optical signal from the first optical source 101) and the second reference signal (received from the first EIT measurement module 109), the first stabilisation module 103 both frequency locks (for relatively short-term stability) and stabilises (for relatively long-term stability) the pump optical signal produced by the first optical source 101.

The splitter 108 therefore receives a frequency locked and stabilised pump optical signal (at 1550 nm) on the third path of the pump optical signal from the first optical source 101 to the splitter 108, and receives a frequency locked and stabilised probe optical signal (at 1560 nm) on the third path of the probe optical signal from the first optical source 101 to the splitter 108.

The splitter 108 splits the pump optical signal into two paths—a first path of the pump optical signal from the splitter 108 to an optical fibre interface 113, and a second path of the pump optical signal from the splitter 108 to a third SHG 115. The splitter 108 also splits the probe optical signal into two paths—a first path of the probe optical signal from the splitter 108 to the optical fibre interface 113, and a second path of the probe optical signal from the splitter 108 to a fourth SHG 117. Following the second paths of the pump and probe optical signals, the pump optical signal is wavelength converted by the third SHG 115 from 1550 nm to 775 nm (that is, it is wavelength-halved or, in other words, frequency doubled) and is thereafter communicated to a second EIT measurement module 119, and the probe optical signal is wavelength converted by the fourth SHG 117 from 1560 nm to 780 nm (that is, it is wavelength-halved or, in other words, frequency doubled) and is thereafter communicated to the second EIT measurement module 119.

The core network node 100 includes a second optical source 121, such as an ECDL, DFB or fibre laser, which is configured to generate the coupling optical signal having a wavelength around 1250 nm, equal to the wavelength required to elevate an electron of a Rydberg-atom in the first and second Rydberg-atom based RF detectors 200, 300 from the second excited state to the predetermined Rydberg state. The second optical source 121 includes a second resonant cavity with a reference at 1250 nm. The second optical cavity is controllable (as described below) to compensate for any drift from this wavelength.

The coupling optical signal is communicated in three paths—a first path of the coupling optical signal from the second optical source 121 to a second stabilisation module 123, a second path of the coupling optical signal from the second optical source 121 to the second EIT measurement module 119, and a third path of the coupling optical signal from the second optical source 121 to the optical fibre interface 113. Following the first path of the coupling optical signal from the second optical source 121 to the second stabilisation module 123, the second stabilisation module 123 is configured to frequency lock the coupling optical signal. Again, this may be achieved using a multiwavelength reference cavity or comb locking mechanism.

Following the second path of the coupling optical signal from the second optical source 121, the coupling optical signal is received at the second EIT measurement module 119. As noted above, the second EIT measurement module 119 also receives the pump optical signal (from the third SHG 115) and the probe optical signal (from the fourth SHG 117). The second EIT measurement module 119 is also configured to receive an RF signal from an RF source 125, the RF signal having a wavelength equal to that required to elevate an electron of a Rydberg-atom in the first and second Rydberg-atom based RF detectors 200, 300 from the predetermined Rydberg state to the further Rydberg state (in other words, having the same wavelength as the RF signal to be detected at the Rydberg-atom based RF detectors 200, 300). The second EIT measurement module 119 is configured to absorb the pump optical signal at 775 nm, the probe optical signal at 780 nm, the coupling optical signal at 1250 nm and the RF signal and produce a third reference signal representative of the amount of absorption of the coupling optical signal. It is noted that this third reference signal is only representative of the coupling optical signal as the pump and probe optical signals have been stabilised by cooperation of the saturation absorption module 107, first EIT measurement module 109, stabilisation module 103 and first resonant cavity, as described above. This third reference signal is used by the second stabilisation module 123 in a feedback control mechanism to control the second resonant cavity to maximise absorption of coupling optical signal by the second EIT measurement module 119. The second EIT measurement module 119, second stabilisation module 123 and second resonant cavity therefore cooperate to stabilise the coupling optical signal at 1250 nm (the wavelength required to elevate an electron of the Rydberg-atom in the first and second Rydberg-atom based RF detectors 200, 300 from the second excited state to the predetermined Rydberg state).

Following the third path of the coupling optical signal from the second optical source 121, the frequency locked and stabilised coupling optical signal, at 1250 nm, is provided to the optical fibre interface 113. The optical fibre interface 113 therefore receives the frequency locked and stabilised pump optical signal at 1550 nm, the frequency locked and stabilised probe optical signal at 1560 nm, and the frequency locked and stabilised coupling optical signal at 1250 nm. These three optical signals are launched onto respective first, second and third optical fibres, which carry the three optical signals to the multiplexor 400.

Turning back to FIG. 1, the pump, probe and coupling optical signals are multiplexed by multiplexor 400 onto a multi-wavelength optical fibre. As noted above, the multiplexed optical signals are then communicated over an optical network 500 to a demultiplexer 600, which demultiplexes the pump, probe and coupling optical signals to respective first, second and third optical fibres. The pump optical signal is split by splitter 700 and distributed to both the first and second Rydberg-atom based RF detectors 200, 300. The probe optical signal is split by splitter 700 and distributed to both the first and second Rydberg-atom based RF detectors 200, 300. The coupling optical signal is split by splitter 700 and distributed to both the first and second Rydberg-atom based RF detectors 200, 300.

Figure 4:
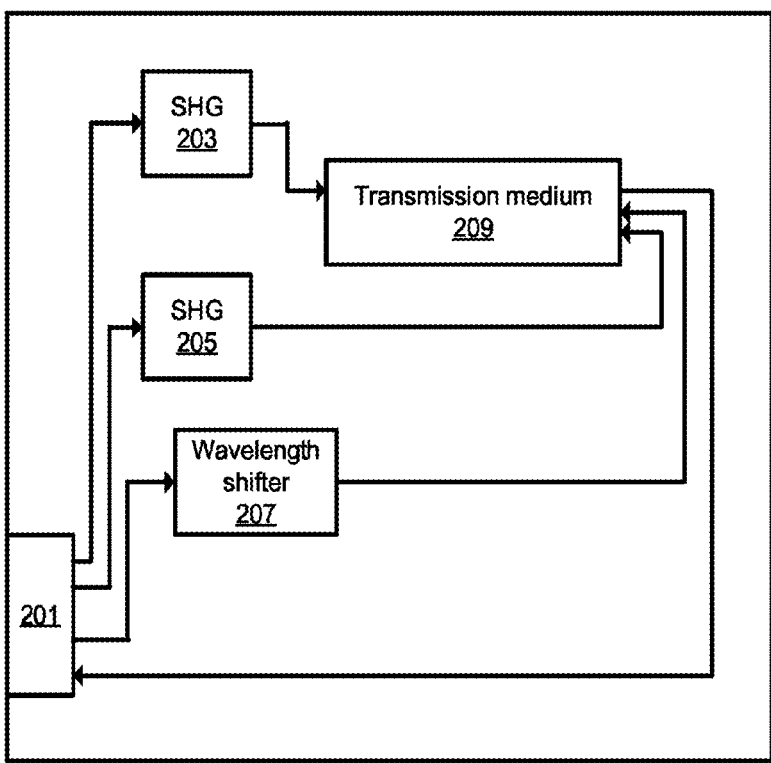
FIG. 4 is a schematic diagram of the Rydberg-atom based radio frequency detector of the network of FIG. 1.

The first and second Rydberg-atom based RF detectors 200, 300 therefore both receive the pump optical signal at 1550 nm, the probe optical signal at 1560 nm and the coupling optical signal at 1250 nm. The first Rydberg-atom based RF detector 200 is shown in more detail in FIG. 4. The first Rydberg-atom based RF detector 200 comprises an optical fibre interface 201, a first SHG 203, a second SHG 205, a wavelength shifter 207, and a transmission medium 209 (such as a glass filled cavity of low-density Rubidium-85 atoms). The optical fibre interface 201 receives the pump, probe and coupling optical signals from the splitter 700. The pump optical signal is communicated to the first SHG 203 which is configured to convert the pump optical signal from 1550 nm to 775 nm (that is, by wavelength-halving or, in other words, frequency doubling). The probe optical signal is communicated to the second SHG 205 which is configured to convert the probe optical signal from 1560 nm to 780 nm (that is, by wavelength-halving or, in other words, frequency doubling). The coupling optical signal is communicated to the wavelength shifter 207 (which may be, for example, an optical modulator). The pump, probe and coupling optical signals are then communicated to the transmission medium 209. The probe optical signal is propagated along the transmission medium 209 in a first direction and the pump and coupling signals are propagated along the transmission medium 209 in a second direction (opposing the first direction), overlapping with the probe signal within the transmission medium 209. The probe optical signal therefore counter-propagates the pump optical signal and the coupling optical signal.

As discussed above, the pump optical signal excites electrons of the Rydberg atoms from the ground state ($5S_{1/2}$) to a first excited state ($5P_{3/2}$), the probe optical signal excites electrons of the Rubidium-85 atoms from the first excited state ($5P_{3/2}$) to a second excited state ($5D_{3/2}$), and the coupling optical signal excites electrons of the Rubidium-85 atoms from the second excited state ($5D_{3/2}$) to the predetermined Rydberg state. An incident RF signal at the transmission medium 209 may then further excite electrons from the predetermined Rydberg state to the further Rydberg state, wherein the energy difference between the predetermined Rydberg state and the further Rydberg state matches the energy of the RF signal (as determined by its frequency). This further excitation of electrons due to the RF signal is detectable as a change in the probe optical signal, such as a change in power.

The probe optical signal is communicated from the transmission medium 209 to the optical fibre interface 201. The optical fibre interface 201 launches the probe optical signal onto an optical fibre, which is carried to the first remote photodetector 800. The first remote photodetector 800 detects the change in the probe optical signal due to the incident RF signal at the transmission medium 209 of the first Rydberg-atom based RF detector 200.

The second Rydberg-atom based RF detector 300 acts in a similar way to the first Rydberg-atom based RF detector 200 such that an RF signal of a particular frequency incident at the second Rydberg-atom based RF detector 300 causes a detectable change in the probe optical signal. The probe optical signal is communicated from the second Rydberg-atom based RF detector 300 to the second photodetector 900 which detects the change in the probe optical signal due to the incident RF signal at the second Rydberg-atom based RF detector 300.

The first and second Rydberg-atom based RF detectors 200, 300 (in cooperation with their respective photodetectors 800, 900) may therefore be used to detect RF signals at a particular frequency by selecting wavelengths for the pump, probe and coupling optical signals so as to elevate electrons of the Rydberg-atoms to a predetermined Rydberg state that has an energy difference with a further Rydberg state that corresponds with the frequency of that RF signal.

The wavelength shifter 207 may be used to wavelength convert the coupling optical signal between 1250nm and 1510nm such that the predetermined Rydberg state may be any one of the $10F_{3/2}$ to $100F_{7/3}$ states, which may then be used to detect incident RF signals between 2.2 GHz and 3.097 THz.

The telecommunications network 1 therefore enables distribution of stabilised optical signals to a plurality of Rydberg-atom based RF detectors to excite electrons of the Rydberg-atoms in each Rydberg-atom based RF detector to a predetermined Rydberg state. Each of the three optical signals are distributed between the optical sources and the Rydberg-atom based RF detectors in one of the low-attenuation optical fibre transmission bands. Furthermore, the pump and probe optical signals are converted by wavelength-halving (in other words, they are frequency doubled). These advantages will be explained by comparison to alternative networks, which will now be described.

A first alternative network includes a first optical source producing a 1560 nm signal and a second optical source producing a 960 nm signal. These optical signals are distributed to a remote Rydberg-atom based RF detector, which uses respective wavelength-halving SHGs to convert the 1560 nm signal to a 780 nm signal and convert the 960 nm signal to a 480 nm signal. These 780 nm and 480 nm signals are used in a two-wavelength excitation scheme to excite the Rydberg atoms to a predetermined Rydberg state. The 960 nm signal of the first alternative network suffers from relatively high attenuation compared to the attenuation experienced by the three optical signals of the telecommunications network 1 (which are all within the optical fibre transmission bands). The first alternative network would therefore require a relatively high-powered optical source for the 960 nm signal to compensate for this attenuation, which increases cost and is relatively unsafe. In other words, the telecommunications network 1 may use relatively low-powered and safer optical sources for the first, second and third optical signals as they are within the low-attenuation optical fibre transmission bands.

A second alternative network includes a first optical source producing a 1560 nm signal and a second optical source producing a 1248 nm optical signal. These optical signals are distributed to a remote Rydberg-atom based RF detector and the 1560 nm signal is wavelength-halved to a 780 nm signal. The 780 nm signal is split and a portion of the 780 nm signal is mixed—by four-wave-mixing—with the 1248 nm signal to produce a 480 nm signal. Four-wave-mixing is a relatively energy inefficient method of producing a signal for exciting the Rydberg-atom relative to the energy efficiency of wavelength-halving the first and second optical signals. The second alternative network would therefore require a relatively high-powered optical source for these two optical signals (particularly the 1248 nm signal) to compensate for this energy inefficiency, which increases cost and is relatively unsafe. In other words, the telecommunications network 1 may use relatively low-powered and safer optical sources for the first and second optical signals as it uses a more energy-efficient wavelength-conversion process.

A further benefit of the telecommunications network 1 is that the 1550 nm and 1560 nm optical signals are sufficiently close together that they may be generated from a single optical source.

Furthermore, as noted above, the coupling optical signal is tuned (by the wavelength shifter) to select the predetermined Rydberg state and therefore the frequency of the RF signal to be detected. This coupling optical signal is in the range of 1250 nm to 1510 nm. The first and second alternative networks above rely on a two-wavelength excitation in which the 480 nm signal is tuned to select the predetermined Rydberg state. A further benefit of the telecommunications network 1 is that it is relatively easy to tune the range of wavelengths of the coupling optical signal compared to tuning a 480 nm signal. This tuning may be implemented using electro-optical modulators or acoustic-optical modulators.

Furthermore, the telecommunications network 1 enables distribution of stable optical signals from a core network node to a plurality of Rydberg-atom based RF detectors. In the prior art, each Rydberg-atom based RF detector would require its own stabiliser. However, by distributing these optical signals, and implementing the stabilisers in the core network node prior to distribution, the number of stabilisers required in the network is reduced.

The skilled person will also understand that the Rydberg-atom based RF detectors may be used to detect electromagnetic signals of different frequencies. That is, for a particular target frequency to be detected, a system may be configured such that the probe optical signal is changed in response to an incident electromagnetic signal at that target frequency to be detected, such as by selecting an appropriate atomic medium (e.g. Rubidium, Caesium or Strontium) having a Rydberg state and a further Rydberg state with an energy difference between those states matching that target frequency and selecting wavelengths for the pump, probe and coupling optical signals corresponding to that Rydberg state, wherein these pump, probe and coupling optical signals have wavelengths within any one of the optical fibre transmission bands when being communicated between the central network node and the Rydberg-atom based RF detectors.

These optical signals, when communicated between the central network node and each Rydberg-atom based RF detector, may therefore have wavelengths within any of the optical fibre transmission bands, such as the O-band (1260-1360 nm), E-band (1360-1460 nm), S-band (1460-1530 nm), C-band (1530-1565 nm), L-band (1565-1625 nm), or U/XL-band (1625-1675 nm). Furthermore, one or more of these optical signals may be wavelength converted at the Rydberg-atom based RF detector to the particular wavelength(s) required to elevate electrons of the Rydberg-atoms. These one or more optical signals may also be wavelength converted at the central network node (to the same wavelengths required to elevate electrons of the Rydberg-atoms) so that the stabilising mechanisms stabilise these optical signals at the same wavelengths.

The Rydberg-atom based RF detectors may also be configured to detect RF signals of a first wavelength in a first timeslot and detect RF signals of a second wavelength in a second timeslot by configuring the pump, probe and/or coupling optical signals and the wavelength shifters of the Rydberg-atom based RF detectors in each timeslot.

Furthermore, it is also non-essential that the Rydberg-atom follows a ladder configuration of electron transitions (as shown in FIG. 2). That is, any configuration (e.g. Lambda, Vee) may be used. It is also non-essential that the transmission medium is a glass-filled cavity of low-density alkali metal as an optical cavity of an optical fibre (e.g. a hollow core fibre) may be used instead.

The skilled person will also understand that it is possible to stabilise and frequency lock the pump, probe and coupling optical signals by alternative mechanisms. In the above telecommunications network 1, the coupling optical signal is frequency locked and stabilised using an RF source that produces an RF signal at the frequency to be detected by the first and second Rydberg-atom based RF detectors. In the event the Rydberg-atom based RF detectors are configured to detect RF signals at different frequencies (e.g. by using different wavelength shifts in the first and second Rydberg-atom based RF detectors), then the stability of the coupling optical signal is dependent on the stability of the wavelength shifter. The core networking node 100 may include a plurality of coupling optical signal generation and stabilisation mechanisms, each configured to generate a stable coupling optical signal at a particular wavelength. The first Rydberg-atom based RF detector may then receive a stable coupling optical signal at a first wavelength and the second Rydberg-atom based RF detector may then receive a stable coupling optical signal at a second wavelength.

It is also non-essential that the Rydberg-atom based RF detectors and their respective photodetectors are positioned remote to one another. Alternatively, the photodetector may be a component of the Rydberg-atom based RF detector.

The skilled person will understand that it is non-essential that the telecommunications network 1 includes a plurality of Rydberg-atom based RF detectors. That is, the Rydberg-atom based RF detectors may instead be any other form of Rydberg-atom based device which may be excited by the three optical signals to a predetermined Rydberg state. These devices may be referred to as a plurality of network nodes, each having an optical fibre interface configured to receive, from one or more remote optical sources, a first optical signal, a second optical signal and a third optical signal, wherein the first, second and third optical signals each have a respective wavelength within an optical fibre transmission band; one or more wavelength converters configured to convert the wavelength of one or more of the first optical signal, second optical signal and third optical signal; and a Rydberg-atom based transmission medium configured to be excited by the first optical signal, second optical signal and third optical signal, following wavelength conversion of one or more of the first optical signal, second optical signal and third optical signal, such that electrons of the Rydberg-atom based transmission medium are excited to a predetermined Rydberg state. It is also non-essential that the telecommunications network includes a plurality of such network nodes. That is, the telecommunications network may include a single network node (having the optical fibre interface, one or more wavelength converters, and the Rydberg-atom based transmission medium) and enjoy the benefit, discussed above, of using one or more relatively low-powered and safer optical sources for the pump, probe and coupling optical signals.

It is also non-essential that lasers are used to produce the three optical signals. That is, any other optical transmitter or coherent optical transmitter may be used instead (such as a Light Emitting Diode). Furthermore, the core networking node may comprise a single optical source, or any number of optical sources, depending on the particular wavelengths required by the Rydberg-atom based device.

FIG. 5 illustrates a method of operating a Rydberg-atom based device. In step S101, the Rydberg-atom based device receives, from one or more remote optical sources, a first optical signal, a second optical signal and a third optical signal, wherein the first, second and third optical signals each have a wavelength within an optical fibre transmission band. In step S103, one or more of the first, second and third optical signals are wavelength converted. In step S105, a transmission medium of the Rydberg-atom based device is excited by the first optical signal, second optical signal and third optical signal, following wavelength conversion of one or more of the first, second and third optical signals, such that electrons of the transmission medium are excited to a predetermined Rydberg state. In optional step S107, an RF signal is detected at the transmission medium as a change in the first, second and/or third optical signal due to the electrons of the transmission medium being excited by the RF signal from the predetermined Rydberg state to a further Rydberg state.

The skilled person will understand that any combination of features is possible within the scope of the invention, as claimed.

The invention claimed is:

1. A network node comprising:
an optical fibre interface configured to receive, from one or more remote optical sources, a first optical signal, a second optical signal and a third optical signal, wherein the first, second and third optical signals each have a respective wavelength within an optical fibre transmission band being one of the O-band, E-band, S-band, C-band, L-band, and U/XL-band;
one or more wavelength converters configured to convert the wavelength of one or more of the first optical signal, second optical signal and third optical signal; and
a Rydberg-atom based transmission medium configured to be excited by the first optical signal, second optical signal and third optical signal, following wavelength conversion of one or more of the first optical signal, second optical signal and third optical signal, such that electrons of the Rydberg-atom based transmission medium are excited to a predetermined Rydberg state.

2. A network node as claimed in claim 1, wherein a wavelength converter of the one or more wavelength converters is configured to halve the wavelength of the first optical signal, second optical signal and/or third optical signal.

3. A network node as claimed in claim 1, being a Radio Frequency, RF, detector.

4. A network node as claimed in claim 3, further comprising a photodetector configured to detect an RF signal at the Rydberg-atom based transmission medium as a change in the first, second and/or third optical signal, wherein the predetermined Rydberg state has an energy difference with a further Rydberg state that corresponds with a frequency of the RF signal.

5. A telecommunications network comprising:
work node as claimed in claim 1; and
one or more optical sources, remote from the network node, configured to generate the first optical signal, the second optical signal and the third optical signal, and communicate the first, second and third optical signals to the network node, wherein the communicated first, second and third optical signals each have a respective wavelength within an optical fibre transmission band being one of the O-band, E-band, S-band, C-band, L-band, and U/XL-band.

6. A telecommunications network as claimed in claim 5, wherein the network node is one of a plurality of network nodes, the one or more optical sources is remote from each network node of the plurality of network nodes, and each network node of the plurality of network nodes comprises:

a respective optical fibre interface configured to receive, from the one or more optical sources, the first optical signal, the second optical signal and the third optical signal;

one or more respective wavelength converters configured to convert the wavelength of one or more of the first optical signal, second optical signal and third optical signal; and a respective Rydberg-atom based transmission medium configured to be excited by the first optical signal, second optical signal and third optical signal, following wavelength conversion of one or more of the first optical signal, second optical signal and third optical signal, such that electrons of the respective Rydberg-atom based transmission medium are excited to a respective predetermined Rydberg state.

7. A telecommunications network as claimed in claim 5, wherein the network node is a Rydberg-atom based Radio Frequency, RF, detector.

8. A telecommunications network as claimed in claim 7, when the network node or the plurality of network nodes is/are as claimed, further comprising:

a photodetector configured to detect an RF signal at the Rydberg-atom based transmission medium as a change in the first, second and/or third optical signal, wherein the predetermined Rydberg state has an energy difference with a further Rydberg state that corresponds with a frequency of the RF signal.

9. A telecommunications network as claimed in claim 5, wherein the one or more optical sources further comprise a wavelength stabilising module for wavelength stabilising the first optical signal, second optical signal and/or the third optical signal.

10. A method of operating a network node in a telecommunications network, the method comprising the steps of:

receiving, from one or more remote optical sources, a first optical signal, a second optical signal and a third optical signal, wherein the first, second and third optical signals each have a respective wavelength within an optical fibre transmission band being one of the O-band, E-band, S-band, C-band, L-band, and U/XL-band;

converting the wavelength of one or more of the first optical signal, second optical signal and third optical signal and exciting a Rydberg-atom based transmission medium by the first optical signal, second optical signal and third optical signal, following wavelength conversion of one or more of the first optical signal, second optical signal and third optical signal, such that electrons of the Rydberg-atom based transmission medium are excited to a predetermined Rydberg state.

11. A method as claimed in-either claim 9, further comprising the step of:

detecting a Radio Frequency, RF, signal at the Rydberg-atom based transmission medium as a change in the first, second and/or third optical signal, wherein the predetermined Rydberg state has an energy difference with a further Rydberg state that corresponds with a frequency of the RF signal.

12. A non-transitory computer readable medium storing instructions which when executed by a processor cause steps of a method of operating a network node in a telecommunications network to be carried out, the steps comprising:

receiving, from one or more remote optical sources, a first optical signal, a second optical signal and a third optical signal, wherein the first, second and third optical signals each have a respective wavelength within an optical fibre transmission band being one of the O-band. E-band, S-band. C-band, L-band, and U/XL-band;

converting the wavelength of one or more of the first optical signal, second optical signal and third optical signal and exciting a Rydberg-atom based transmission medium by the first optical signal, second optical signal and third optical signal, following wavelength conversion of one or more of the first optical signal, second optical signal and third optical signal, such that electrons of the Rydberg-atom based transmission medium are excited to a predetermined Rydberg state.

13. A device comprising the processor and the non-transitory computer readable medium of claim 12.

* * * * *